(12) United States Patent
Teramura et al.

(10) Patent No.: US 7,539,233 B2
(45) Date of Patent: May 26, 2009

(54) LENS HOLDER AND LASER ARRAY UNIT USING THE SAME

(75) Inventors: Yuichi Teramura, Kanagawa-ken (JP); Kazuhiko Nagano, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 83 days.

(21) Appl. No.: 11/392,537

(22) Filed: Mar. 30, 2006

(65) Prior Publication Data

US 2006/0222042 A1     Oct. 5, 2006

(30) Foreign Application Priority Data

Mar. 31, 2005   (JP) ............................... 2005-103811

(51) Int. Cl.
*H01S 3/08* (2006.01)
(52) U.S. Cl. ...................................... 372/108; 372/107
(58) Field of Classification Search ................ 372/108, 372/101
See application file for complete search history.

(56) References Cited

U.S. PATENT DOCUMENTS

| 4,850,674 | A | * | 7/1989 | Hasselskog ................. 359/820 |
| 5,467,328 | A | * | 11/1995 | Murakami et al. ....... 369/44.16 |
| 6,995,912 | B2 | | 2/2006 | Okazaki et al. |
| 2004/0247011 | A1 | * | 12/2004 | Okazaki et al. ............. 372/108 |

FOREIGN PATENT DOCUMENTS

JP     2004-134641     4/2004

* cited by examiner

*Primary Examiner*—Minsun Harvey
*Assistant Examiner*—Patrick Stafford
(74) *Attorney, Agent, or Firm*—Sughrue Mion, PLLC

(57) ABSTRACT

In a laser array unit in which a plurality of laser beams emitted from a laser array is received by a lens array, the lens holder for fixedly bonding the lens array is formed such that the length of the surface on which the lens array is bonded in the direction orthogonal to the optical axis direction of the lens is longer than the length of the surface to be bonded to a certain other fixing member in the same direction.

20 Claims, 14 Drawing Sheets

LENS HOLDER AND LASER ARRAY UNIT USING THE SAME

BACKGROUND OF THE INVENTION

1. Field of the Invention

The present invention relates to a lens holder to be fixedly bonded to a certain other fixing member after a lens array or an elongated lens is fixedly bonded thereto. The present invention also relates to a laser array unit using such lens holder.

2. Description of the Related Art

A laser unit in which a plurality of laser beams are inputted to a single fiber to combine the beams in order to obtain a high power laser beam is known as described, for example, in U.S. Pat. No. 6,995,912 and Japanese Unexamined Patent Publication No. 2004-134641. The laser unit is basically constituted by a semiconductor laser array (which may be an integrated unit or constituted by a plurality of discrete elements) having a plurality of luminous points to emit a plurality of laser beams; a single optical fiber; and a condensing optical system for condensing and coupling the plurality of laser beams emitted from the semiconductor lasers to the optical fiber.

In such type of laser unit, optical components, including a collimating lens, a condenser lens, and the like constituting the condensing optical system, a lens holder for holding these components, and the like are generally very small. For fixing these small components to the main body of the laser unit, a fixing structure using an adhesive is widely used as described, for example, in U.S. Pat. No. 6,995,912.

In the mean time, it is customary that the semiconductor laser array is fixed on a heat block formed of a material such as copper having a high thermal conductivity directly or through a submount, so that the heat generated by the semiconductor laser array is dissipated efficiently. When such heat block is used, it is often the case that the collimating lens array for collimating the laser beams emitted from the semiconductor laser array is fixed to a lens holder of such kind as described above, and the lens holder is fixed on the heat block. In this configuration, a UV cure adhesive is often used for fixing the collimating lens array to the lens holder, in which case the lens holder is generally formed of transparent glass so that a sufficient amount of UV rays is irradiated on the area to be bonded.

As described above, when the lens holder formed of glass is fixed to the heat block formed of a metal, an adhesive is generally used. In such case, it has been a problem that it is difficult to secure both high bonding strength between the lens holder and heat block, and high positional accuracy for fixing the collimating lens array to the lens holder. Hereinafter, such problem will be detailed by taking, for example, the beam combining laser module disclosed in U.S. Pat. No. 6,995,912 as an example. That is, the problem often found in a beam combining laser module in which each of a plurality of laser beams emitted from the semiconductor laser array is collimated by each of the collimating lenses of the collimating lens array, condensed by a single condenser lens, and coupled to the optical fiber will be detailed hereinbelow.

In the beam combining laser module described above, if the magnification of the condensing optical system constituted by the collimating lens array and condenser lens is 7.8×, the movement of the laser beams at the lens section is magnified by 7.8 times on the input face of the optical fiber. Here, it is preferable that the movement of the leaser beams on the input face of the optical fiber is not greater than 1.5 μm in order for the laser beams to be effectively coupled to the optical fiber with a core diameter of, for example, 60 μm when positional variations of the lens and semiconductor laser array are taken into account. In addition, when the magnification of the optical system described above is taken into account, the relative movement between the lens system and semiconductor laser array should be within approximately 0.2 μm.

Further, for the collimating lens array in which a plurality of collimating lenses is arranged side by side, if the array moves around the center of the array in the longitudinal direction (lens arrangement direction), the outermost collimating lenses move the most. In order to keep the relative positional movement between the outermost collimating lenses and semiconductor laser array less than approximately 0.2 μm, the rotational movement described above should be kept within 0.2' (arcmin) when the length from the center of the array to the outermost collimating lenses is 3.6 mm.

It is known that an organic adhesive, such as a UV cure adhesive or the like shrinks when solidifying. Consequently, if the difference in thickness or angle of the adhesive occurs between the collimating lens array and lens holder, the inclination in the rotational direction described above may occur through the shrinking solidification. In order to keep such movement of the collimating lens array within 0.2', the collimating lens array and lens holder should be bonded together with a face alignment accuracy (accuracy in setting two bonding surfaces in parallel with each other) of within approximately 2' between them when considering the volume shrinkage of the adhesive which is generally around 10%.

The face alignment accuracy between the collimating lens array and lens holder depends on their positional measurement accuracy and surface irregularity. If the surface irregularity of the bonding surface is fixed, then a longer bonding surface may provide a higher face alignment accuracy.

In the mean time, the collimating lens array is generally formed of transparent glass, such as BK7 glass or plastic, and it is customary that the lens holder for fixing the array is also formed of the same or similar material in order to improve the surface irregularity of the surface to which the collimating lens array is bonded and fixing accuracy.

On the other hand, the heat block to which the semiconductor laser array is fixed is formed of a metal, such as copper or the like in order to improve heat dissipation efficiency. When the lens holder formed of glass or the like is fixedly bonded thereto, therefore, the thermal expansion coefficient differs greatly with each other. Consequently, strain is developed in the bonded section between the heat block and lens holder when subjected to changes in ambient temperature or temperature changes arising from activation and deactivation of the semiconductor laser array. The amount of strain is dependent on the maximum length of the bonded section, and when the strain grows significantly, the bonded section may unstick.

Conventional lens holders are shaped in a rectangular solid, so that if they are made larger in order to improve the face alignment accuracy with the collimating lens, then the bonding surface of the holder with the heat block inevitably becomes lengthy, which leads to unsticking of the bonded section. On the other hand, if they are made smaller in order to avoid the unsticking of the bonded section, the face alignment accuracy is degraded.

The above description is a problem that may occur in the case where a lens array is fixedly bonded to a lens holder, and then the holder is fixedly bonded to a heat block. But a similar problem may occur in the case where an elongated lens, such as a cylindrical lens or the like is fixedly bonded to a lens holder instead of the lens array, or where the lens holder is fixedly bonded to a fixing member other than the heat block.

Further, even if the fixing member such as the heat block and the lens holder have the identical thermal expansion coefficient, if the adhesive layer between them has a high heat insulating property, which is normally the case, the same problem of strain development may also occur when subjected to the temperature change.

The present invention has been developed in view of the circumstances described above, and it is an object of the present invention to provide a lens holder capable of securing a high face alignment accuracy with a lens array or an elongated lens, and minimizing the strain in the bonded section with a certain other fixing member arising from the temperature changes thereof.

It is a further object of the present invention to secure a high face alignment accuracy between a lens array or an elongated lens and a lens holder for fixedly bonding the lens array or elongated lens thereto, and to minimize the strain in the bonded section between the lens holder and a certain other fixing member in a laser array unit constructed such that a plurality of laser beams emitted from a laser array is received by the lens array or elongated lens.

SUMMARY OF THE INVENTION

The lens holder according to the present invention is a lens holder to be fixedly bonded to a certain other fixing member, such as the heat block described above after a lens array or an elongated lens is fixedly bonded thereto. The lens holder is formed such that the length of the surface on which the lens array or elongated lens is bonded in the direction orthogonal to the optical axis direction of the lens is longer than the length of the surface to be bonded to the certain other fixing member in the same direction.

Preferably, the lens holder according to the present invention is formed based on the assumption that the material for the lens holder has a linear expansion coefficient different from that of the certain other fixing member, such as the heat block or the like.

Preferably, the surface to be bonded to the certain other fixing member described above is shaped substantially in square, regular polygon, or round.

Further, the lens holder according to the present invention is preferably formed of substantially transparent glass, synthetic resin (plastic), or ceramics.

A laser array unit according to the present invention is a laser array unit using the lens holder described above. The laser array unit comprises:

a laser array having a plurality of luminous points;

a laser supporting member with the laser array fixed thereto;

a lens array or an elongated lens for receiving a plurality of laser beams emitted from the laser array; and the lens holder fixedly bonded to the laser supporting member after the lens array or elongated lens is fixedly bonded thereto.

Another laser array unit according to the present invention is a laser array unit also using the lens holder described above. The laser array unit comprises:

a laser array having a plurality of luminous points;

a laser supporting member, such as the heat block described above or the like with the laser array fixed thereto;

a reference member, such as the base plate placed on the bottom plate of the package or the like with the laser supporting member fixed thereto;

a lens array or an elongated lens for receiving a plurality of laser beams emitted from the laser array; and the lens holder fixedly bonded to the reference member after the lens array or elongated lens is fixedly bonded thereto.

Preferably, a collimating lens array constituted by a plurality of collimating lenses arranged side by side, each for collimating each of the laser beams emitted from the plurality of luminous points, is used as the lens array or elongated lens in each of the laser array units according to the present invention described above.

Preferably, the laser array units formed in the manner as described above further comprises:

a single optical fiber; and a condensing optical system for condensing and inputting the laser beams emitted from the plurality of luminous points to the optical fiber, the condensing optical system being formed to include the lens array or elongated lens.

Further, the laser array units according to the present invention are preferably formed based on the assumption that the laser array is constituted by GaN semiconductor lasers.

The lens holder according to the present invention is formed such that the length of the surface for bonding the lens array or elongated lens in the direction orthogonal to the optical axis direction of the lens is longer than the length of the surface to be bonded to a certain other fixing member, such as the heat block or the like in the same direction, unlike the conventional lens holders formed in rectangular solid. Thus, the former length may be set long enough to improve the face alignment accuracy with the lens array or elongated lens. On the other hand, the latter length may be set appropriately short within a range which secures the bonding strength to minimize the strain that may occur at the bonded section due to the temperature change, thereby unsticking or the like arising from the strain may be prevented.

When the certain other fixing member, such as the heat block or the like and lens holder are formed of materials having different linear expansion coefficients with each other, the strain arising from temperature changes are more likely to occur at the bonded section compared with the case where they are formed of materials having the same linear expansion coefficient. Accordingly, if the present invention is applied to the case where the certain other fixing member and lens holder are formed of materials having different linear expansion coefficients with each other, a more significant strain preventing effect may be obtained.

In the lens holder according to the present invention, it is necessary to take into account the entire bonding surface when considering the magnitude of the strain in the bonded section. As described above, from the viewpoint of minimizing the strain in the bonded section, the maximum length of the bonding surface is preferably short. On the other hand, a wider bonding surface provides a stronger bonding strength which is desirable for realizing stable fixation. Thus, it is desirable that the surface to be bonded is shaped substantially in square having the same horizontal and vertical size in order to secure the maximum bonding strength while minimizing the strain. More preferably, it is shaped substantially in regular polygon having the same length in every direction, including diagonal direction, or substantially in round.

Further, when the lens holder according to the present invention is formed of substantially transparent glass or ceramics, and if a UV cure adhesive is used for bonding the lens array or elongated lens to the lens holder, and for bonding the lens holder to a certain other fixing member, then UV rays may be irradiated well on the bonding section through the lens holder.

In the mean time, the laser array unit according to the present invention uses the lens holder according to the present invention described above. Thus, a high face alignment accuracy between the lens array or elongated lens and the lens holder for fixedly bonding it may be obtained, and the strain in the bonded section between the lens holder and a certain other fixing member (laser supporting member or the reference member where the laser supporting member is fixed) may be minimized.

Further, when the laser array units according to the present invention further includes a single optical fiber and the condensing optical system as described above to form a beam combining laser unit, a high face alignment accuracy between the lens array or elongated lens and optical fiber may be obtained since a high face alignment accuracy is ensured between the lens array or elongated lens and lens holder. Consequently, the laser beams may be coupled to the optical fiber with a high coupling efficiency.

Still further, when the laser array is constituted by GaN semiconductor lasers, the amount of heat generated by the laser array is greater compared with the case where it is constituted by other types of semiconductor lasers. Thus, the temperature change in the laser supporting member having the laser array fixed thereon also is greater when the laser array is activated or deactivated. Accordingly, the strain arising from the temperature change is more likely to occur at the bonded section between the laser supporting member and the lens holder, and between the reference member having the laser supporting member fixed thereon and the lens holder. Consequently, application of the present invention to a laser array unit constituted by GaN semiconductor lasers may provide a more significant strain preventing effect.

DESCRIPTION OF THE PREFERRED EMBODIMENTS

Hereinafter, embodiments of the present invention will be described with reference to the accompanying drawings.

Figure 1:
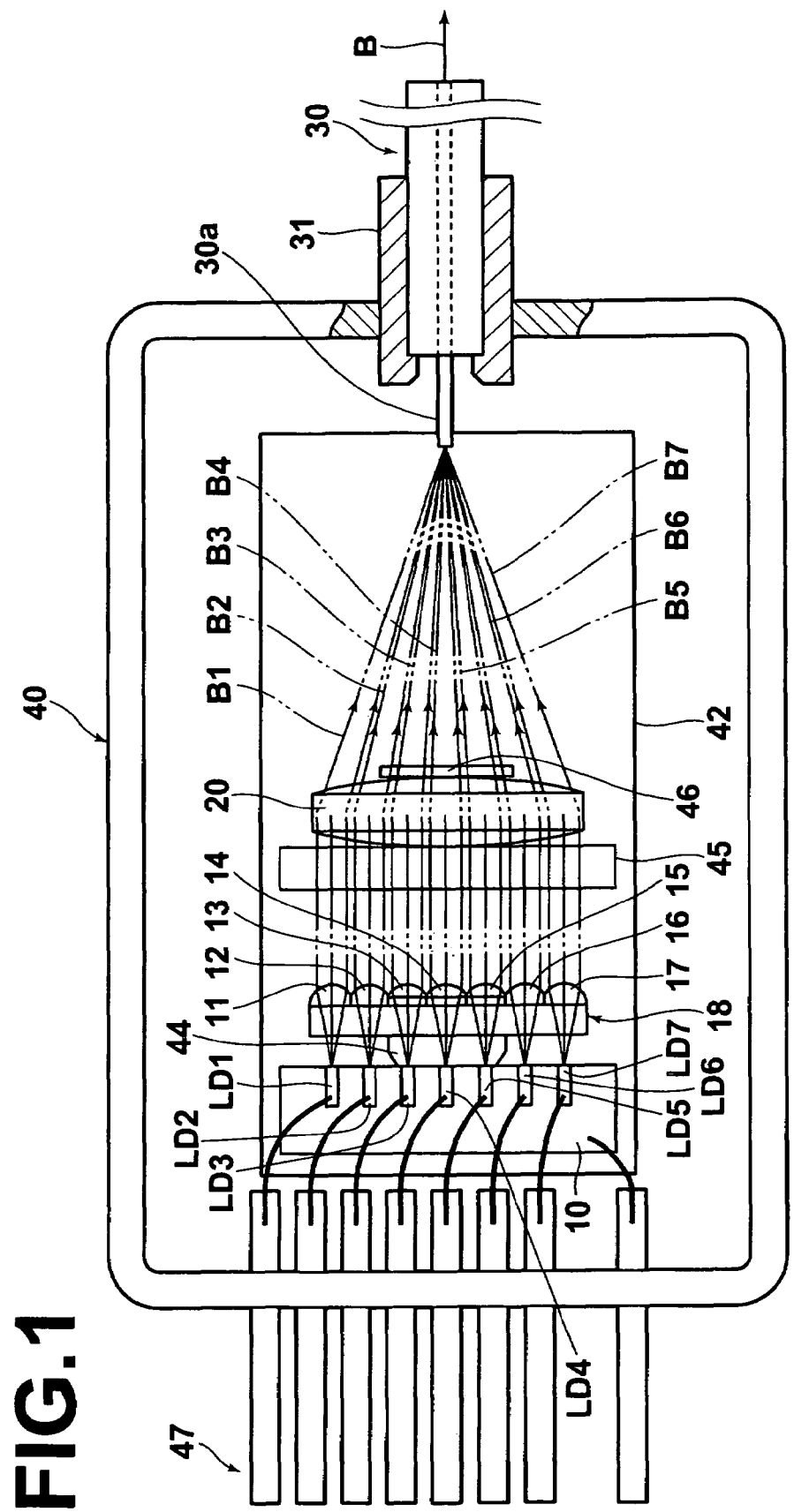
FIG. 1 is a partially broken plan view of the beam combining laser unit according to a first embodiment of the present invention.
Figure 2:
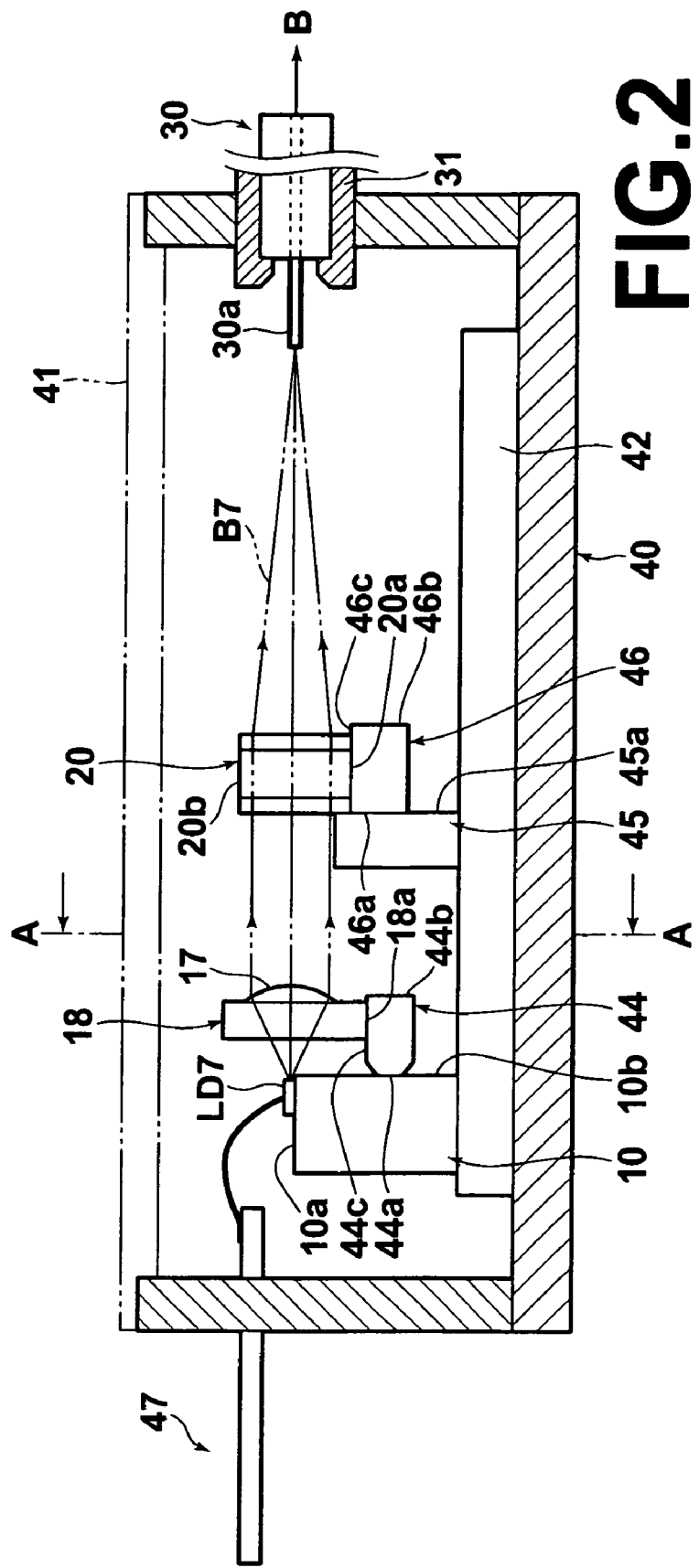
FIG. 2 is a partially broken side view of the beam combining laser unit described above.
Figure 3:
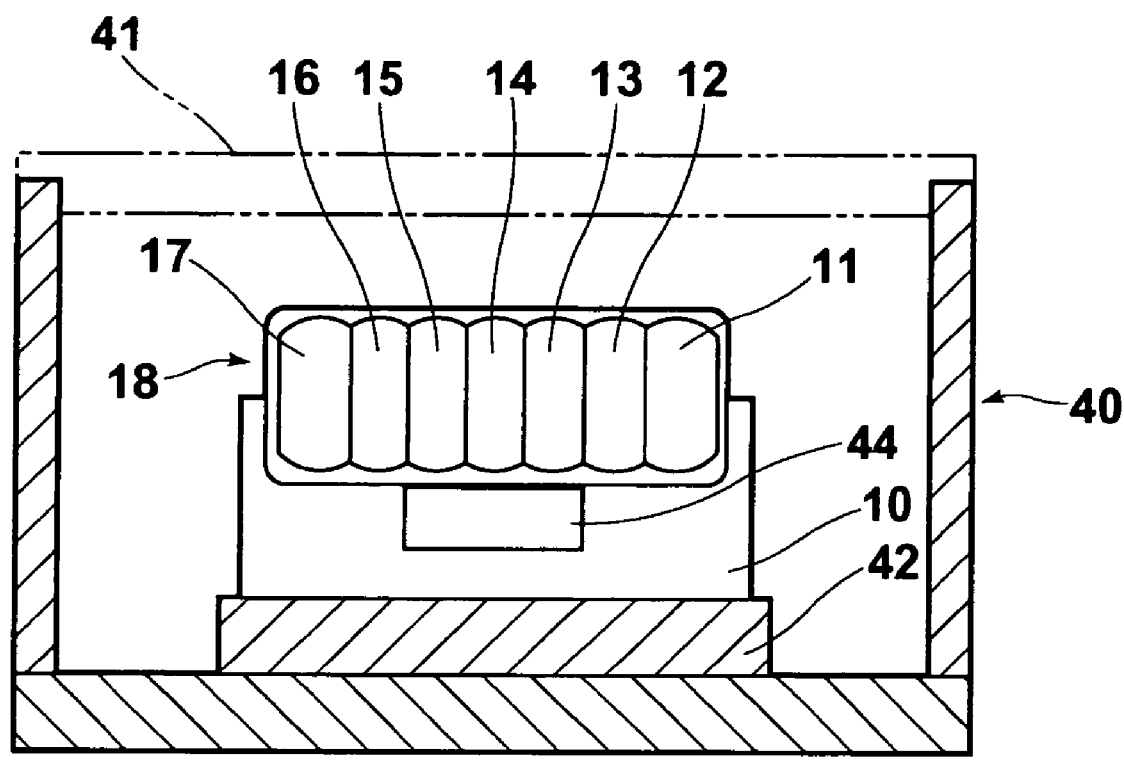
FIG. 3 is a partial front view of the beam combining laser unit described above.

FIGS. 1, 2, and 3 are a plan view, a side view, and a partial front view respectively of the UV high luminance beam combining laser unit according to a first embodiment of the present invention. As shown in the drawings, the beam combining unit includes, for example, 7 chip state transverse multimode GaN semiconductor lasers LD1, LD2, LD3, LD4, LD5, LD6, and LD7 fixedly disposed on a heat block 10 having a high thermal conductivity; a collimating lens array 18 constituted by integrally formed collimating lenses 11, 12, 13, 14, 15, 16, and 17, each corresponding to each of the lasers LD1, LD2, LD3, LD4, LD5, LD6, and LD7; a single condenser lens 20; and a single multimode optical fiber 30.

The GaN semiconductor lasers LD1 to LD7 oscillate at wavelengths in the range of 400 nm to 410 nm with an output power of around 200 mW. These GaN semiconductor lasers LD1 to LD7 constitute a laser array having 7 luminous points. In the present embodiment, single mode lasers are used as the GaN semiconductor lasers LD1 to LD7, but multimode semiconductor lasers may also be used.

The laser beams B1, B2, B3, B4, B5, B6, and B7 emitted from the GaN semiconductor lasers LD1, LD2, LD3, LD4, LD5, LD6, and LD7 are collimated by the collimated lenses 11, 12, 13, 14, 15, 16, and 17 of the collimating lens array respectively. FIG. 3 shows the laser unit viewed from the line A-A toward the collimating lens array 18 in FIG. 2.

The collimated laser beams B1 to B7 are condensed by the condenser lens 20 and focused on the input face of the core 30a of the multimode optical fiber 30. In the present embodiment, the collimating lenses 11 to 17 and condenser lens 20 constitute a condensing optical system which together with the optical fiber 30 constitutes a beam combining optical system. That is, the laser beams B1 to B7 condensed by the condenser lens 20 are inputted to the input core face 30a of the multimode optical fiber 30, and combined into a single laser beam B while propagating therethrough before being outputted therefrom. As for the multimode optical fiber 30, a step index type, graded index type, or hybrid type optical fiber may be used.

In the present embodiment, optical elements constituting the beam combining laser unit are accommodated in a box type package 40 having an opening at the top, and hermetically held in a closed space defined by the package 40 and a package lid 41 when the opening is closed by the lid 41. The input end portion of the multimode optical fiber 30 is held by a ferrule 31 and fixed to the side wall of the package 40.

A base plate 42 is fixed on the bottom surface of the package 40 on which the heat block 10 is attached. The GaN semiconductor lasers LD1 to LD7 are fixed on the upper surface 10a, and a collimating lens holder 44 for holding the collimating lens array 18 is fixed on the front surface 10b of the heat block 10. Further, a lens fixing block 45 is fixed on the upper surface of the base plate 42, and a condenser lens holder 46 for holding the condenser lens 20 is fixed on the front surface of the lens fixing block 45. Wires 47 for supplying drive currents to the GaN semiconductor lasers LD1 to LD7 are drawn outside through an opening formed on a side wall of the package 40.

As shown in FIG. 3, each of the collimating lenses 11 to 17 of the collimating lens array 18 is formed such that a region of an aspheric circular lens including the optical axis is cut out by parallel planes in an elongated form. Such collimating lens array 18 may be formed, for example, by molding optical glass. In the present embodiment, the collimating lens array 18 is formed of PK-3 glass having a linear expansion coefficient of $143 \times 10^{-7}$ as an example. Other materials such as BK7 glass and the like are also preferably used for the collimating lens array 18.

The collimating lenses 11 to 17 are formed such that the aperture diameter in the arrangement direction of the luminous points of the GaN semiconductor lasers LD1 to LD7 (left-right direction in FIG. 3) is smaller than that in the direction orthogonal thereto (up-down direction in FIG. 3), and closely disposed in the arrangement direction of the luminous points.

In the mean time, as for the GaN semiconductor lasers LD1 to LD7, those having an emission width of 2 μm, and respectively emitting laser beams B1 to B7 with beam divergence angles of, for example, 10 and 30 degrees in the parallel and orthogonal directions to the active layer respectively. The GaN semiconductor lasers LD1 to LD7 are arranged such that the luminous points are disposed linearly in the parallel direction to the active layer.

Accordingly, the laser beams B1 to B7 emitted from the respective luminous points enter the respective collimating lenses 11 to 17 having the elongated shape with the direction of the maximum divergence angle corresponding to the direction of the greater aperture diameter, and the direction of the minimum divergence angle corresponding to the direction of the smaller aperture diameter. That is, the respective collimating lenses 11 to 17 having the elongated shape are effectively used for the incident laser beams B1 to B7 having an elliptical shape in cross section by reducing a non-effective area as much as possible. Specifically, in the present embodiment, the effective aperture diameters of each of the collimating lenses 11 to 17 are 1.1 mm and 3.6 mm in the horizontal and vertical directions respectively, and beam diameters of each of the laser beams B1 to B7 incident on each of the collimating lenses are 0.9 mm and 2.6 mm in the horizontal and vertical directions respectively. The focal length f1 and numerical aperture (NA) of each of the collimating lenses 11 to 17 are 3 mm and 0.6 respectively with a lens arrangement pitch of 1.2 mm.

In the mean time, the condenser lens 20 is formed such that a region of an aspheric circular lens including the optical axis is cut out by parallel planes in an elongated form, which is longer in the arrangement direction of the collimating lenses, i.e. the horizontal direction, and shorter in the vertical direction. The focal length f2 of the condenser lens 20 is 24.0 mm with a magnification of 8×. The condenser lens 20 may also be formed by molding. The condenser lens 20 and collimating lens array 18 may be formed of a synthetic resin instead of glass.

A step index type optical fiber with a core diameter of 60 μm and a numerical aperture of 0.23 is used as the multimode optical fiber 30. In the configuration of the present embodiment, a coupling efficiency of approximately 0.8 is obtained for the leaser beams B1 to B7 to the multimode optical fiber 30. Accordingly, a combined laser beam B with an output power exceeding approximately 1 W is obtained when the output power of each of the GaN semiconductor lasers LD1 to LD7 is approximately 200 mW.

In the beam combining laser unit configured in the manner as described above, the collimating lens array 18 and condenser lens 20 should be fixed with the optical axis thereof arranged accurately in parallel with the core axis of the multimode optical fiber 30, and that state should always be maintained in order to ensure a high coupling efficiency of the laser beams B1 to B7 to the multimode optical fiber 30. Hereinafter, a method for realizing such fixing structure will be described.

Fixing structures for fixing the collimating lens array 18, collimating lens holder 44, and the like will be described first. In the present embodiment, the heat block 10 is formed in a rectangular solid using Kovar having an excellent thermal conductivity and grinding workability. The lower surface thereof is metalized by gold evaporation and fixed on the Au plated base plate 42 using low temperature soldering. The linear expansion coefficient of the Kovar is $0.7 \times 10^{-5}$. The heat block 10 may also be formed of a metal such as CuW or CuMo, or ceramic such as AlN (aluminum nitride) or the like instead of Kovar. The base plate 42 is formed of, for example, CuW, CuMo, Kovar or the like, and fixed on the bottom surface of the package 40.

The rectangular solid heat block 10 is fixed on the surface of the base plate 42 such that the front surface 10b thereof is orthogonal to the surface of the base plate 42. The front surface 10b is mirror finished to serve as the mounting surface of the collimating lens holder 44, which also serves as a reference surface to be described later.

Figure 19:
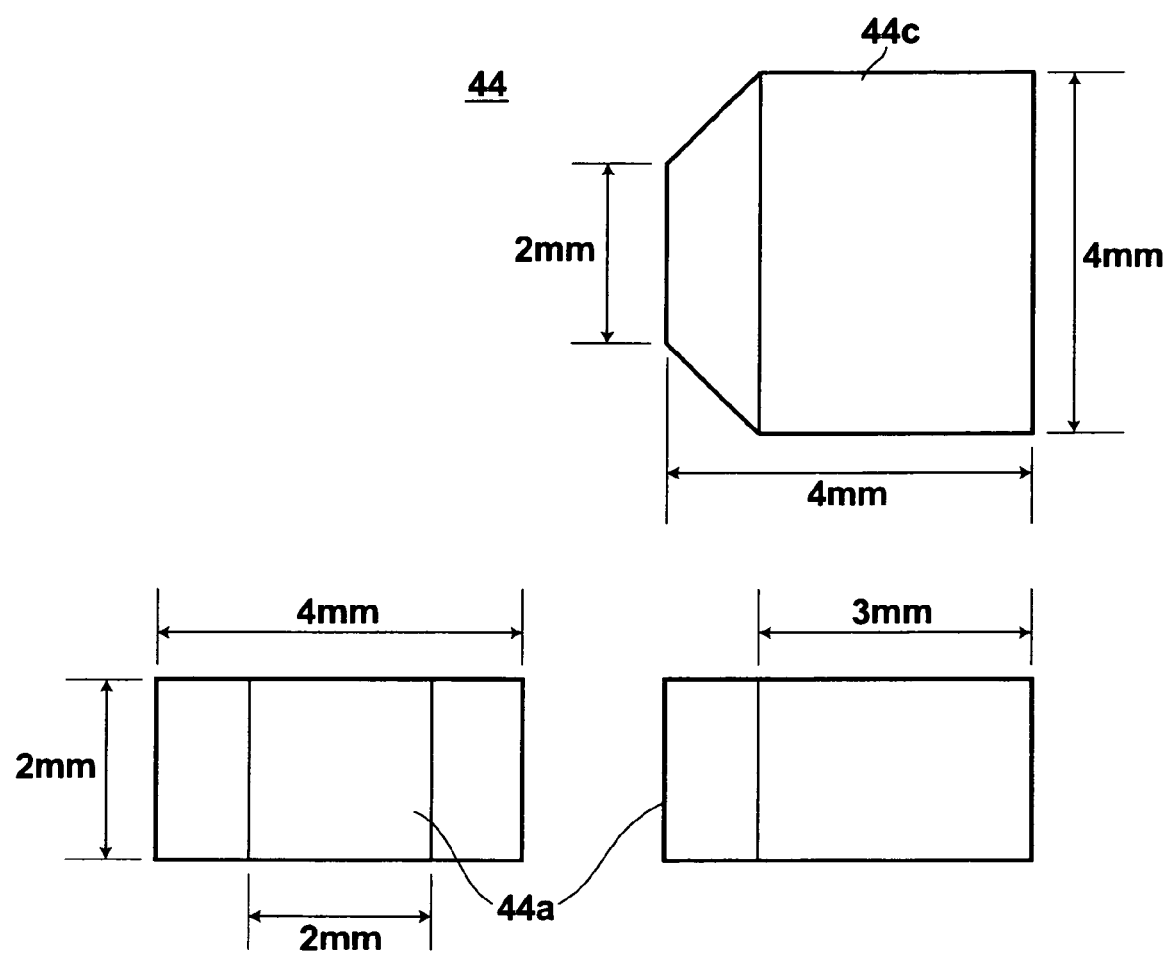
FIG. 19 is a trihedral view of the lens holder used in the beam combing laser unit shown in FIG. 1.

In the mean time, the collimating lens holder 44 is formed using UV transmissive BK7 glass having a linear expansion coefficient of $0.7 \times 10^{-5}$. FIG. 19 is a trihedral view of the collimating lens holder 44 illustrating the detailed shape thereof. As shown in FIG. 19, the collimating lens holder 44 has a hexagonal planar shape. The width (dimension in the longitudinal direction of the collimating lens array 18), length, and thickness thereof are 4 mm, 4 mm and 2 mm respectively, and the length of the rear surface 44a to be bonded to the heat block 10 as described later is 2 mm.

The GaN semiconductor lasers LD1 to LD7 are mounted on the upper surface 10a of the heat block 10 using an AuSn alloy having a melting point of 280 degrees Celsius as the brazing filler metal. Here, a mounting accuracy of within ±3.0 μm may be obtained.

In the mean time, the ferrule 31 holding the input end portion of the multimode optical fiber 30 is hermetically fixed to a side wall of the package 40 using a brazing filler metal so that the input end portion of the multimode optical fiber 30 is fixed to the package 40. Here, the multimode optical fiber 30 is fixed to the package 40 such that the core axis thereof is orthogonal to the front surface 10b of the heat block 10.

Figure 4:
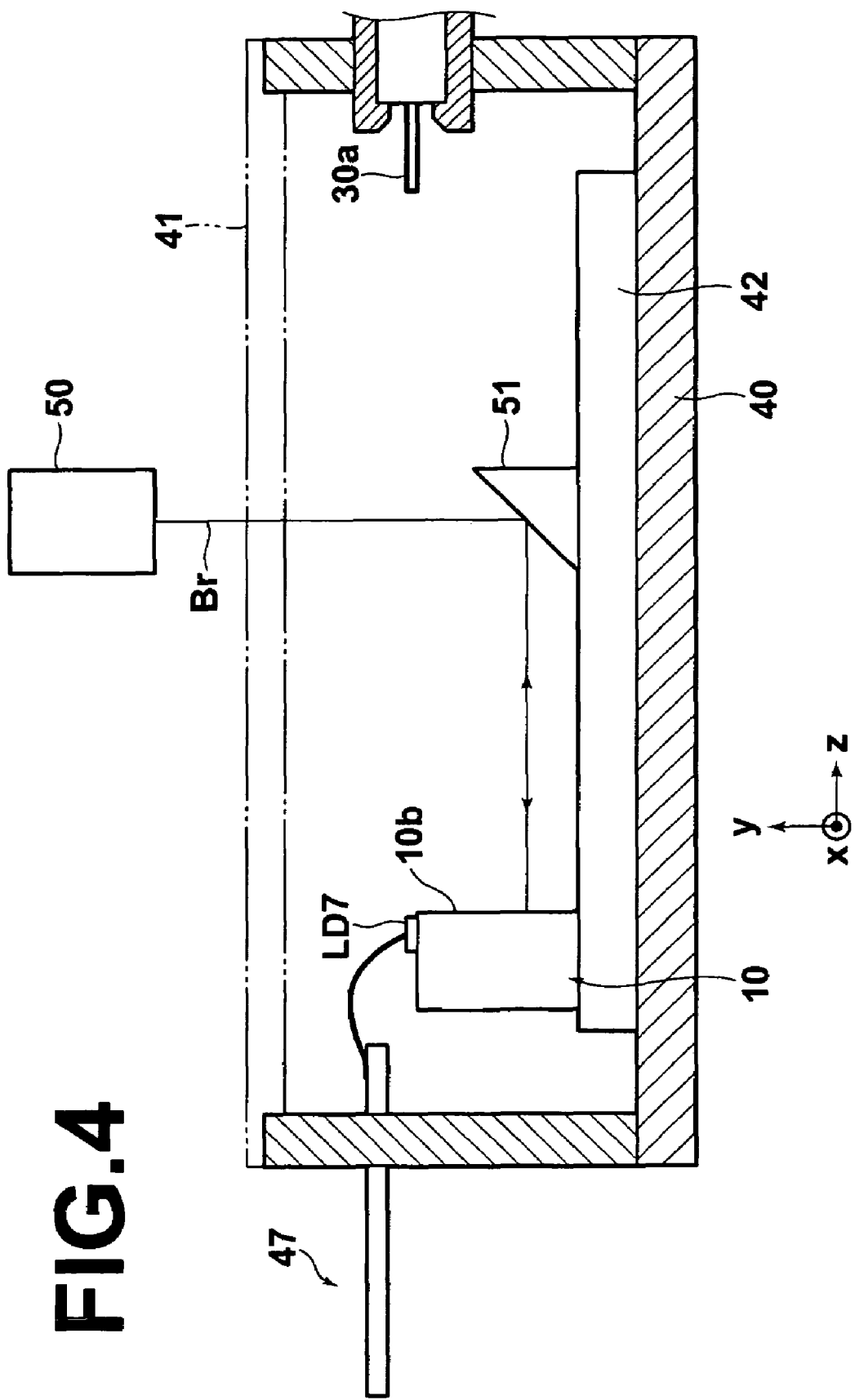
FIG. 4 is a drawing for explaining the method for assembling the beam combining laser unit described above.

Then, prior to fixedly bonding the collimating lens holder 44, the angle of the front surface 10b serving as the mounting surface and reference surface thereof to a reference direction is measured using a laser autocollimator 50 and a mirror 51 placed on the base plate 42 as shown in FIG. 4. In the present embodiment, a laser beam Br emitted from the laser autocollimator 50 is reflected by the mirror 51 to change the traveling direction of the beam by 90 degrees so that the beam is incident on the front surface 10b of the heat block 10 at a right angle, and the traveling direction z of the laser beam Br after reflected by the mirror 51 is defined as the reference direction.

The laser autocollimator 50 receives the laser beam Br reflected by the front surface 10b of the heat block 10, and reflected back thereto by the mirror 51 to measure the angle of the front surface 10b of the heat block 10 to the reference direction z. The angle is defined by the inclination angles θx and θy in the x and y axis directions which are orthogonal to the reference direction z and also with each other. That is, if the front surface 10b of the heat block 10 is absolutely orthogonal to the reference direction z, then the inclination angles θx and θy are determined to be zero (θx=θy=0). The y axis direction is the same as the traveling direction of the beam Br emitted and directed downward from the laser autocollimator 50. The measured inclination angles θx and θy are recorded on a recording sheet or the like, or stored in a storage means.

Figure 5:
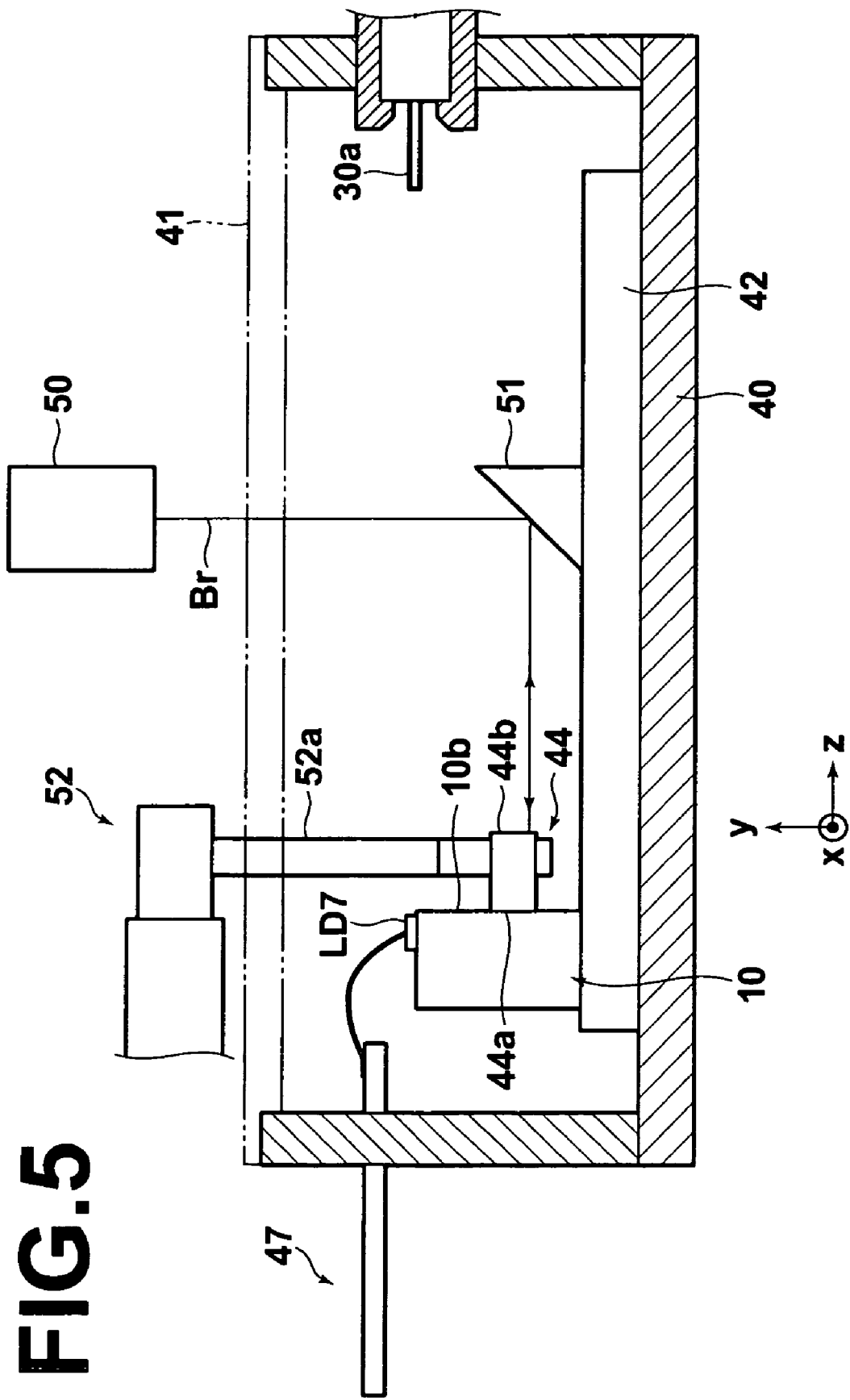
FIG. 5 is a drawing for explaining the method for assembling the beam combining laser unit described above.

Then, the collimating lens holder 44 is held such that the rear surface 44a serving as the bonding surface of the collimating lens holder 44 is gently abutted to the front surface 10b of the heat block 10 using, for example, a mechanical hand 52 having a gripper for gripping the collimating lens holder 44 as shown in FIG. 5. As for the mechanical hand 52, for example, a mechanical hand having six axes is used, in which the gripper 52a may be translated in three axis directions and rotationally moved around three axes.

When holding the collimating lens holder 44 in the manner as described above, the angle of the front surface 44b thereof serving as the reference surface to the reference direction z is continuously measured. The angle measurement is performed in the same manner as that of the front surface 10b of the heat block 10, and the angle is also defined by the inclination angles θx and θy described above.

Here, the mechanical hand 52 is operated such that the continuously measured inclination angles θx and θy correspond respectively to the inclination angles θx and θy measured for the front surface 10b of the heat block 10, and the collimating lens holder 44 is positioned at a predetermined location in x and y directions. The operation of the mechanical hand 52 is halted when aforementioned state is achieved. Then, an adhesive is applied between the front surface 10b of the heat block 10 and the rear surface 44a of the collimating lens holder 44 gently abutting to the front surface 10b, and the collimating lens holder 44 is fixedly bonded to the front surface 10b of the heat block 10 by solidifying the adhesive.

The collimating lens holder 44 may be easily positioned at a predetermined location in x and y directions by sliding the rear surface 44a thereof on the front surface 10b of the heat block 10.

Here, the collimating lens holder 44 is formed such that the rear surface 44a and front surface 44b thereof are in parallel with each other with an error margin of ±15". Consequently, the correspondence of the inclination angles θx and θy measured for the front surface 44b of the collimating lens holder 44 to the inclination angles θx and θy measured for the front surface 10b of the heat block 10 respectively means that the rear surface 44a of the collimating lens holder 44 is in parallel with the front surface 10b of the heat block 10. Accordingly, if the collimating lens holder 44 is fixedly bonded to the front surface 10b of the heat block 10 with the correspondence state being maintained, the collimating lens holder 44 may be fixed with the rear surface 44a thereof arranged in parallel with the front surface 10b of the heat block 10.

Further, the operation of the mechanical hand 52 is controlled based on the outside dimensions of the collimating lens holder 44 measured precisely in advance to set the angular position of the collimating lens holder 44 around the z axis at a predetermined position. Thus, the collimating lens holder 44 is fixed with the upper surface 44c arranged in parallel with the base plate 42.

As for the adhesive described above, for example, a UV cure adhesive is used. The collimating lens holder 44 is formed of UV transmissive glass as described above so that a sufficient amount of UV rays for solidifying the adhesive may be irradiated on the adhesive through the collimating lens holder 44.

Figure 6:
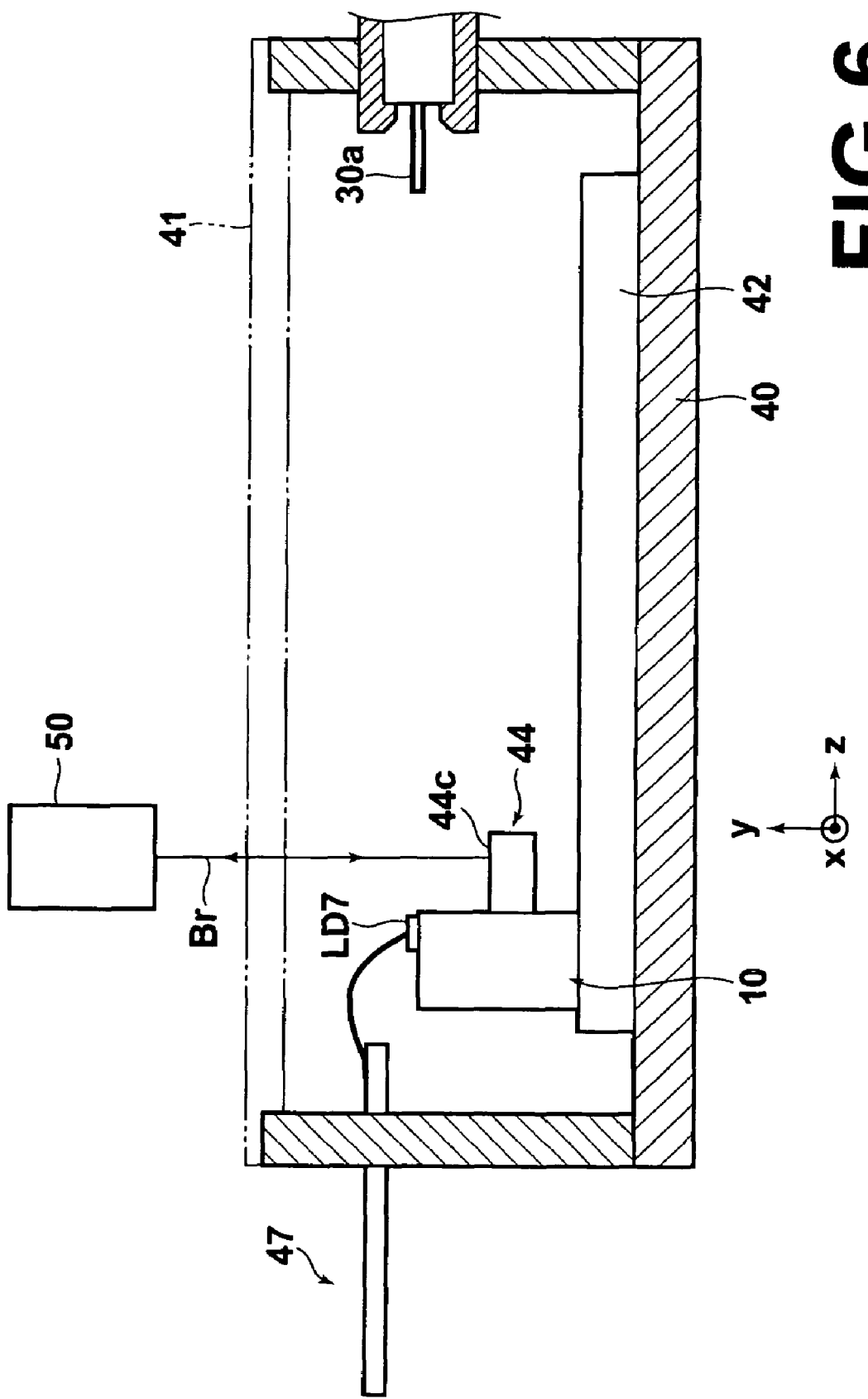
FIG. 6 is a drawing for explaining the method for assembling the beam combining laser unit described above.

Thereafter, the mechanical hand 52 is operated such that the gripper 52a is withdrawn from the package 40 to outside. Then, the angle of the upper surface 44c of the fixed collimating lens holder 44 to a reference direction is measured using the laser autocollimator 50 again as shown in FIG. 6. The reference direction in this case is the traveling direction of the laser beam Br emitted and directed downward from the laser autocollimator 50 (which is the same direction as that shown in FIGS. 4 and 5). That is, the angle of the upper surface 44c of the collimating lens holder 44 to the reference direction y is defined by the inclination angles $\phi x$ and $\phi z$ in x and z axis directions here. That is, if the upper surface 44c of the collimating lens holder 44 is absolutely orthogonal to the reference direction, the inclination angles $\phi x$ and $\phi z$ are determined to be zero ($\phi x=\phi z=0$). The measured inclination angles $\phi x$ and $\phi z$ are recorded on a recording sheet or the like, or stored in a storage means.

Figure 7:
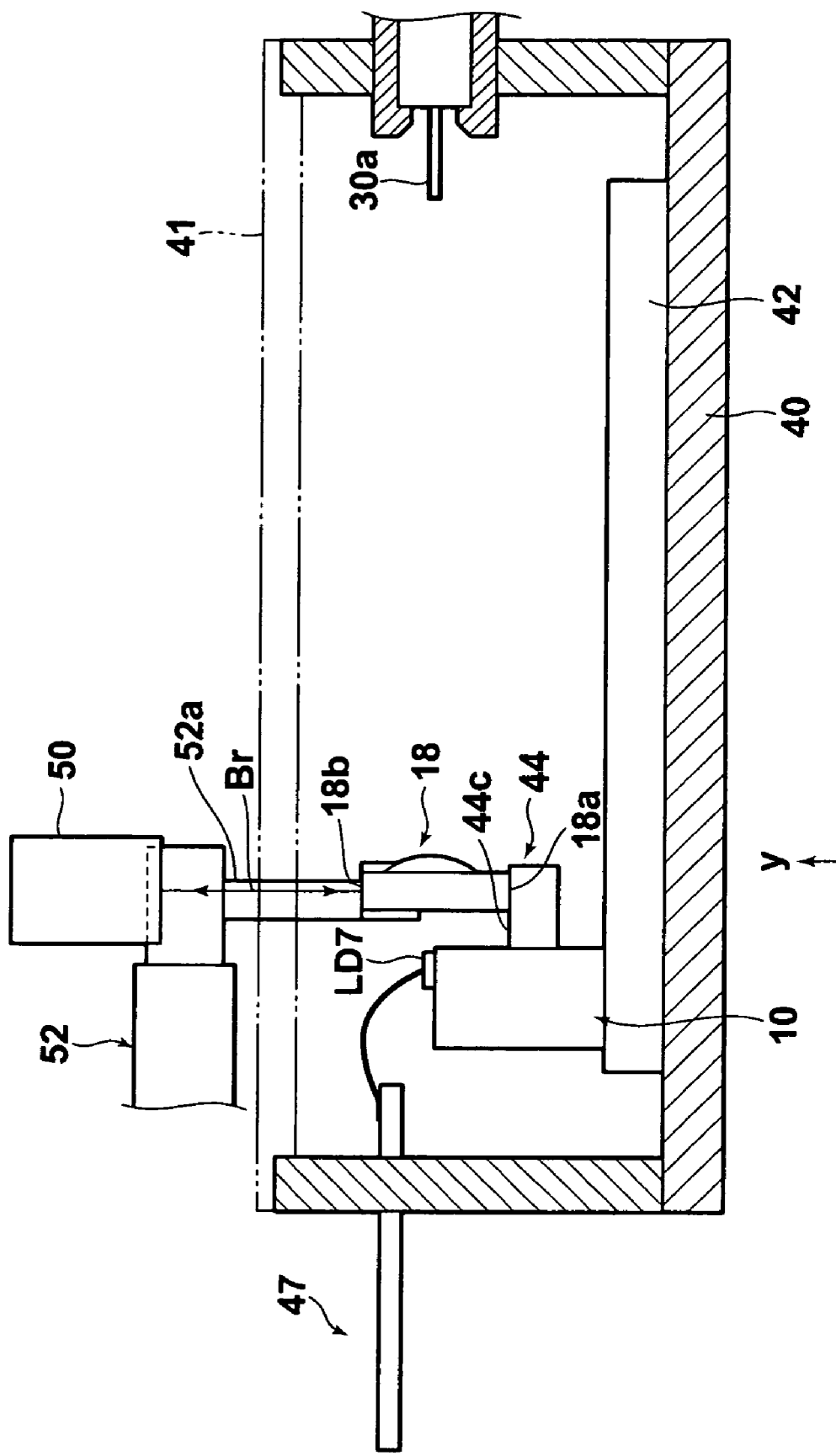
FIG. 7 is a drawing for explaining the method for assembling the beam combining laser unit described above.

Then, the collimating lens array 18 is held such that the lower surface 18a thereof serving as the bonding surface is gently abutted to the upper surface 44c of the collimating lens holder 44 using the mechanical hand 52 again as shown in FIG. 7. When holding the collimating lens array 18 in the manner as described above, the angle of the upper surface 18b thereof to the reference direction y is continuously measured. The angle measurement is performed in the same manner as that of the upper surface 44c of the collimating lens holder 44, and the angle is also defined by the inclination angles $\phi x$ and $\phi z$ described above.

Here, the mechanical hand 52 is operated such that the continuously measured inclination angles $\phi x$ and $\phi z$ correspond respectively to the inclination angles $\phi x$ and $\phi z$ measured for the upper surface 44c of the collimating lens holder 44, and the collimating lens array 18 is positioned at a predetermined location in x and z directions. The operation of the mechanical hand 52 is halted when the aforementioned state is achieved. Then, an adhesive is applied between the upper surface 44c of the collimating lens holder 44 and the lower surface 18a of the collimating lens array 18 gently abutting to the upper surface 44c, and the collimating lens array 18 is fixedly bonded to the upper surface 44c of the collimating lens holder 44 by solidifying the adhesive.

The collimating lens array 18 may be easily positioned at a predetermined location in x and z directions by sliding the lower surface 18a thereof on the upper surface 44c of the collimating lens holder 44.

Here, the collimating lens 18 is formed such that the lower surface 18a and upper surface 18b thereof are in parallel with each other. Consequently, the correspondence of the inclination angles $\phi x$ and $\phi z$ measured for the upper surface 18b of the collimating lens array 18 to the inclination angles $\phi x$ and $\phi z$ measured for the upper surface 44c of the collimating lens holder 44 respectively means that the lower surface 18a of the collimating lens array 18 is in parallel with the upper surface 44c of the collimating lens holder 44. Accordingly, if the collimating lens array 18 is fixedly bonded to the upper surface 44c of the collimating lens holder 44 with the correspondence state being maintained, the collimating lens array 18 may be fixed with the lower surface 18a thereof arranged in parallel with the upper surface 44c of the collimating lens holder 44.

Further, the operation of the mechanical hand 52 is controlled, for example, based on the outside dimensions of the collimating lens array 18 to set the angular position of the collimating lens array 18 around the y axis at a predetermined position. Thus, the collimating lens array 18 is fixed with the core axis of each of the collimating lenses 11 to 17 arranged in parallel with the core axis of the multimode optical fiber 30.

Here, the collimating lens array 18 may be molded such that the lower surface 18a and upper surface 18b thereof are in parallel with each other with an error margin of ±15". Accordingly, the collimating lens array 18 may be aligned such that the lower surface 18a thereof is in parallel with the upper surface 44c of the collimating lens holder 44 with a maximum error margin of 30" through the angular measurement using the upper surface 18b thereof as the reference surface. The parallelism between the lower surface 18a and upper surface 18b of the collimating lens array 18 in the lens arrangement direction may also be achieved with an error margin of around ±15".

As for the adhesive described above, for example, a UV cure adhesive is used. The collimating lens holder 44 is formed of UV transmissive glass as described above, and the collimating lens array 18 is also formed of such material, so that a sufficient amount of UV rays for solidifying the adhesive may be irradiated on the adhesive through the collimating lens holder 44 and collimating lens array 18.

When the collimating lens holder 44 is fixedly bonded to the heat block 10, and the collimating lens array 18 is fixedly bonded to the collimating lens holder 44 in the manner as described above, the collimating lens array 18 may be fixed with the optical axis of each of the collimating lenses 11 to 17 arranged in parallel with the core axis of the multimode optical fiber 30.

Hereinafter, the face alignment accuracy required between the collimating lens array 18 and collimating lens holder 44 will be described in detail. In considering the positional accuracy of the luminous points of the GaN semiconductor lasers and the collimating lens array 18, the displacement thereof in x or y direction causes an output power drop of the optical fiber 30 due to displaced beam positions on the core face thereof. Considering that the positional accuracy for mounting the GaN semiconductor lasers LD1 to LD7 is ±3 μm and magnification of the optical system is 8×, the position of the laser beams B1 to B7 is thought to vary within a range of ±24 μm. Further, if a spot diameter of 10 μm for the converged laser beams B1 to B7 is added thereto, the movement of the laser beams B1 to B7 after optical alignment should be within ±1 μm. From this, the face alignment accuracy between the collimating lens array 18 and collimating lens holder 44 in x and y directions should be ±0.12 μm. In the mean time, the misalignment between the collimating lens array 18 and collimating lens holder 44 in z direction (optical axis direction) also causes an output power drop of the optical fiber 30 due to broadened beam diameters of the laser beams B1 to B7 on the core face thereof. The impact of this misalignment, however, is smaller compared with the misalignment in x or y direction, and an error margin of ±1 μm for the face alignment accuracy is allowed in this direction.

In the collimating lens array 18, the collimating lenses most remote from the supporting point are most likely to be affected by the positional displacement. In the present embodiment, the distance from the center of the array to the outermost lens is 3.6 mm, so that the movement of the array in the $\phi z$ direction having an impact on the positional accuracy in y direction should be within 0.1' (arcmin). On the other hand, the movement of the array in the $\phi x$ or $\phi y$ direction having an impact on the positional accuracy of the array in z direction is allowed to a degree of approximately 1'. Further, if the amount of thermal contraction of the adhesive is assumed to be 10%, the face alignment accuracy between the collimating lens array 18 and collimating lens holder 44 in the $\phi z$ direction should be within 1', and that in the $\phi x$ direction should be within 10' including the surface irregularity of the collimating lens holder 44 and heat block 10.

Now, referring back to FIG. 2, the fixing structures for fixing the condenser lens 20 and condenser lens holder 46 will be described. The lens fixing block 45 for fixing the condenser lens holder 46 is formed in a rectangular solid using AlN, and the lower surface thereof is metalized by gold evaporation and fixed on the Au plated base plate 42 using low temperature soldering like the heat block 10. Here, the lens fixing block 45 is fixed on the base plate 42 such that the front surface 45a thereof is in parallel with the front surface 10b of the heat block 10. For this purpose, the laser autocollimator 50 and mechanical hand 52 shown in FIG. 5 may be used.

The condenser lens holder 46 is fixedly bonded first to the lens fixing block 45 fixed in the manner as described above, and then the condenser lens 20 is fixedly bonded on the upper surface 46c of the condenser lens holder 46. The condenser lens holder 46 is formed in a rectangular solid using, for example, UV transmissive glass. When fixedly bonding the condenser lens holder 46 to the lens fixing block 45, the method used for fixedly bonding the collimating lens holder 44 on the front surface 10b of the heat block 10 may be used in the same manner. That is, the front surface of the condenser lens holder 46 is used as the reference surface, and the condenser lens holder 46 is fixedly bonded with the rear surface 46a serving as the bonding surface thereof arranged in parallel with the front surface 45a of the lens fixing block 45 in this case.

The parallelism between the rear surface 46a and front surface 46b of the condenser lens holder 46 may be achieved with an error margin of around ±15". Such parallelism may be achieved by grinding the rear surface 46a and front surface 46b of the condenser lens holder 46.

Then, the condenser lens 20 is fixedly bonded on the upper surface 46c of the fixedly bonded condenser lens holder 46. The condenser lens 20 having an elongated shape in the horizontal direction as described earlier is formed such that a lower surface 20a serving as the bonding surface to the condenser lens holder 46 and an upper surface 20b serving as the reference surface are in parallel with each other. When bonding the condenser lens 20 on the upper surface 46c of the condenser lens holder 46, the method used for fixedly bonding the collimating lens array 18 on the upper surface 44c of the collimating lens holder 45 may be used in the same manner. That is, the upper surface 20b of the condenser lens 20 is used as the reference surface, and the condenser lens 20 is fixedly bonded with the lower surface 20a serving as the bonding surface thereof arranged in parallel with the upper surface 46c of the condenser lens holder 46 in this case.

The parallelism between the lower surface 20a and upper surface 20b of the condenser lens 20 may be achieved with an error margin of around ±15". Such parallelism may be achieved by grinding the lower surface 20a and upper surface 20b of the condenser lens 20. Further, the parallelism between the upper surface 20b serving as the reference surface and optical axis may also be achieved with an error margin of around ±15".

The condenser lens 20 is fixed on the condenser lens holder 46 with the optical axis thereof corresponding to the core axis of the multimode optical fiber 30 in the manner as described above. In addition, the collimating lens array 18 is fixed with the optical axis of each of the collimating lenses 11 to 17 arranged in parallel with the core axis of the multimode optical fiber 30 as described above. Consequently, a high coupling efficiency of the laser beams B1 to B7 to the multimode optical fiber 30 is ensured.

The collimating lens holder 44 used in the present embodiment is formed such that the length of the upper surface 44c for bonding the collimating lens array 18 in the direction orthogonal to the optical axis direction (left-right direction in the drawing) of the lens (length in the up-down direction in the drawing) is longer, which is 4 mm, than the length of the rear surface 44a (FIG. 2) to be bonded to the heat block 10 in the same direction, which is 2 mm, as shown in FIG. 19. Thus, the former length may be set long enough to improve the face alignment accuracy with the collimating lens array 18. On the other hand, the latter length may be set appropriately short within a range which ensures the bonding strength to minimize the strain that may occur at the bonded section with the heat block 10 due to the temperature change, thereby unsticking or the like arising from the strain may be prevented.

In the present embodiment, in particular, the heat block 10 and collimating lens holder 44 are formed of materials having different linear expansion coefficients with each other as described above. Therefore, the strain is more likely to occur between them when subjected to temperature changes, so that a marked strain minimizing effect may be obtained in this embodiment. Of course, it is preferable that these components are formed of the materials having the same or similar linear expansion coefficient for minimizing the strain.

Each of the GaN semiconductor lasers LD1 to LD7 constituting the laser array generates a greater amount of heat compared with other types of semiconductor lasers. Thus, the temperature change in the heat block 10 with the laser array fixed thereon also is greater when the laser array is activated or deactivated. Accordingly, the strain arising from the temperature change is more likely to occur at the bonded section between the heat block 10 and collimating lens holder 44. A more significant strain preventing effect may be obtained in the present embodiment, since the present invention is applied to such GaN semiconductor lasers LD1 to LD7 in the present embodiment.

Hereinafter, the relationship between the surface irregularity and positional accuracy of the collimating lens array 18 and collimating lens holder 44 will be described. When two surfaces each having a surface roughness of 0.4 μm and 0.1 μm respectively are bonded together, a maximum variation of 0.5 μm in the thickness of the adhesion layer is inevitable at both ends. The angular accuracy between the two surfaces is calculated as the ratio to the length of a side of the surface. Thus, if two surfaces are contacted with each other with a contact surface having a width of 2 mm or 4 mm, the angular accuracy of 0.9' or 0.45' is the limit which may be achieved reliably. Assuming that the measurement accuracy of the autocollimator is 0.1' (6") and the parallelism between the upper and lower surfaces of the lens is ±0.25' (15"), with the inherent accuracy of the autocollimator taken into account, accuracies of 0.8' and 1.4' may be achieved for bonding surfaces having a width of 4 mm and 2 mm respectively. Thus, for the collimating lens array 18 and collimating lens holder 44 which should have a face alignment accuracy of less than or equal to 1', it may be said that a bonding surface having a width of 4 mm in the direction orthogonal to the optical axis direction thereof is required with the other regions having a width of 2 mm in order to achieve the required accuracy.

Preferably, the front surface 10b of the heat block 10, front surface 44b and upper surface 44c of the collimating lens holder 44, upper surface 18b of the collimating lens array 18, front surface 45a of the lens fixing block 45, front surface 46b and upper surface 46c of the condenser lens holder 46, and upper surface 20b of the condenser lens 20, which serve as the reference surfaces, are mirror finished with the surface roughness Ra of less than 0.08 μm in order to properly reflect the laser beam Br emitted from the laser autocollimator 50 without scattering. Generally, the reference surface finished with such surface roughness Ra allows angle measurement to the reference direction with a measurement accuracy of ±5".

In the mean time, it is preferable that the bonding surfaces which are bonded to the reference surfaces, more specifically, the rear surface 44a of the collimating lens holder 44, lower surface 18a of the collimating lens array 18, rear surface 46a of the condenser lens holder 46, and lower surface 20a of the condenser lens 20 are formed coarser than the reference surfaces so that the adhesive is properly spread between these surfaces and the reference surfaces. Preferably, the bonding surface has a surface roughness, for example, in the range of 0.15 μm to 0.35 μm when the reference surface has a surface roughness Ra less than 0.08 μm as described above. The surface roughness may be measured using, for example, a stylus roughness measuring instrument.

Figure 8:
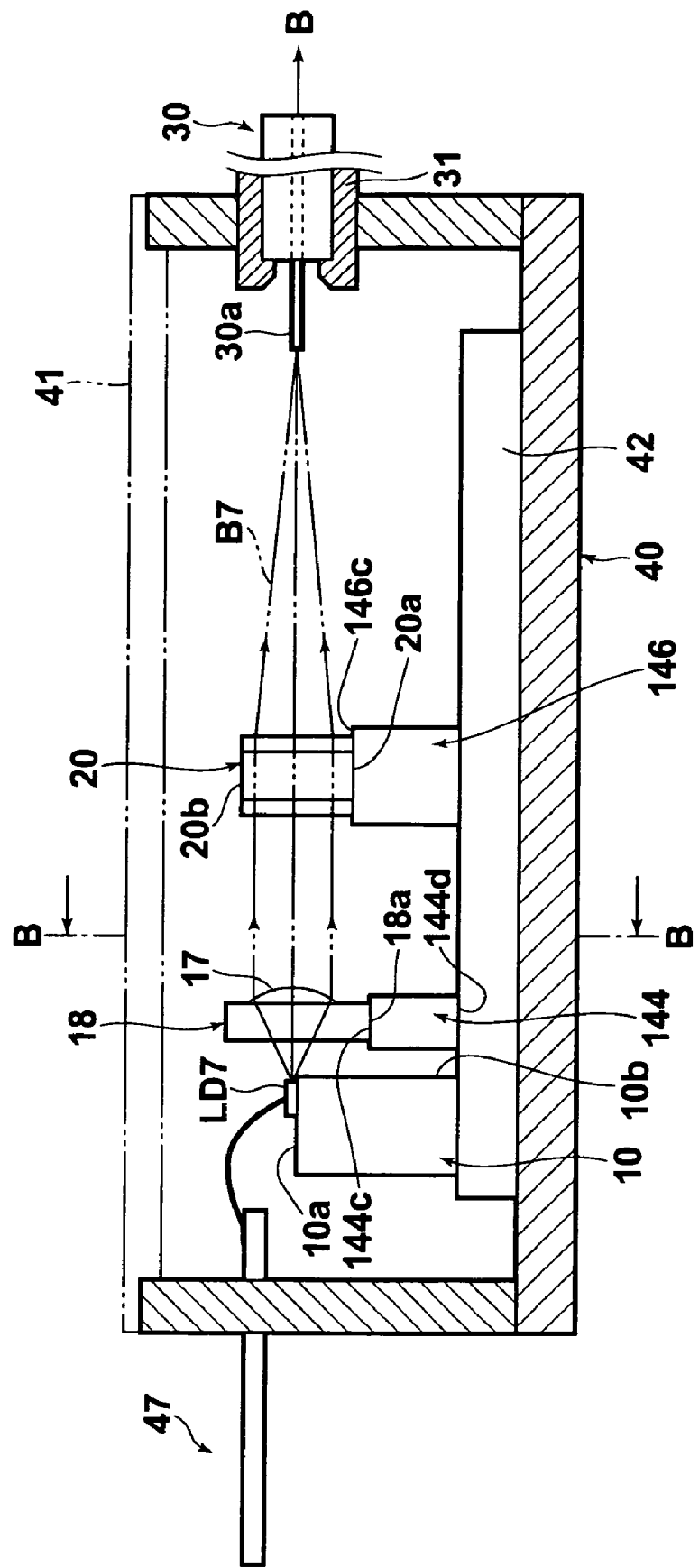
FIG. 8 is a partially broken side view of the beam combining laser unit according to a second embodiment of the present invention.
Figure 9:
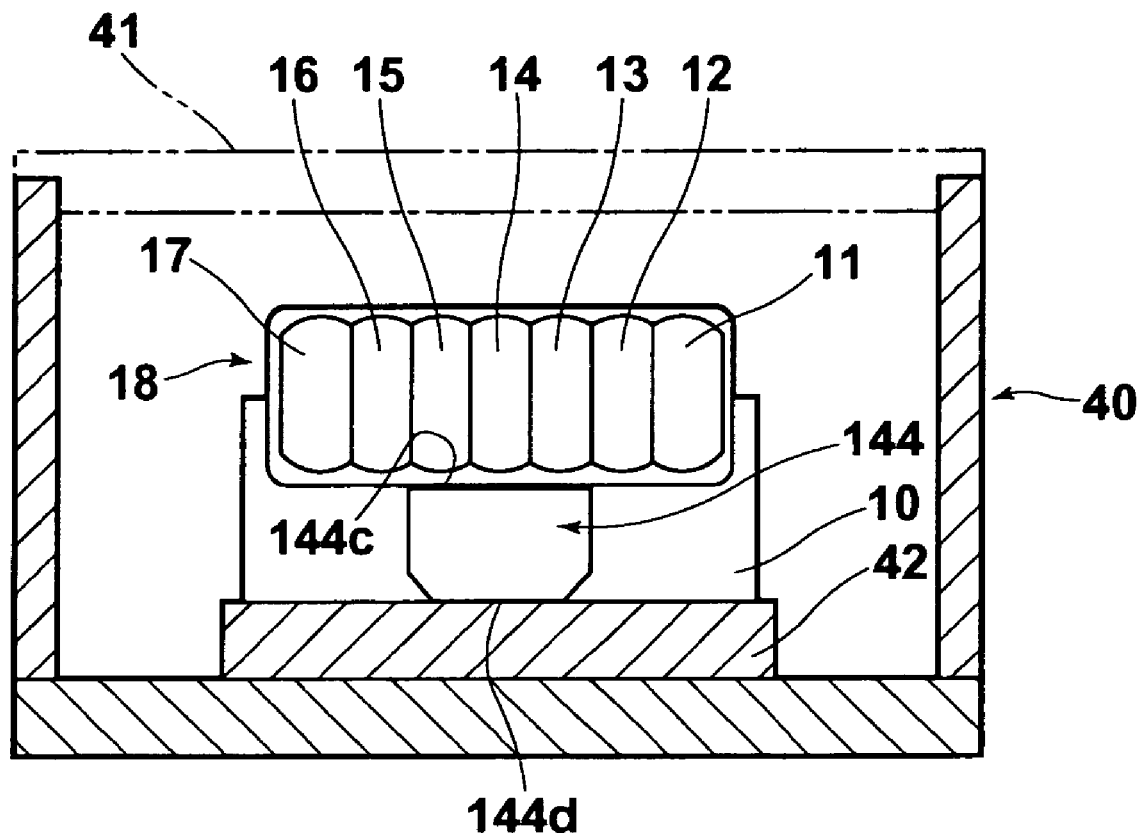
FIG. 9 is a partial front view of the beam combining laser unit shown in FIG. 8.

Hereinafter, a second embodiment of the present invention will be described. FIGS. 8 and 9 are a side view and a partial front view of the UV high luminance beam combining laser unit according to the second embodiment of the present invention respectively. FIG. 9 shows the laser unit viewed from the line B-B toward the collimating lens array 18 in FIG. 8. In FIGS. 8 and 9, the elements identical to those shown in FIGS. 1, 2, and 3 are given the same reference numerals and will not be elaborated upon further here unless otherwise specifically required (the same applies hereinafter also).

In the second embodiment, a collimating lens holder 144 with the collimating lens array 18 fixedly bonded on the upper surface 144c thereof is fixedly bonded on the base plate 42 serving as the reference member directly instead of the heat block 10.

In the present embodiment, the collimating lens holder 144 is also formed such that the length of the upper surface 144c for bonding the collimating lens array 18 in the direction orthogonal to the optical axis direction of the lens (in the left-right direction in the drawing) is longer than the length of the lower surface 144d to be bonded to the base plate 42 in the same direction as shown in FIG. 9. Thus, the former length may be set long enough to improve the face alignment accuracy with the collimating lens array 18. On the other hand, the latter length may be set appropriately short within a range which ensures the bonding strength to minimize the strain that may occur at the bonded section with the base plate 42 due to the temperature change, thereby unsticking or the like arising from the strain may be prevented.

Hereinafter, shapes of the lens holder of the present invention will be described with reference to FIGS. 10 to 18. These drawings show, as examples, a lens holder to be fixed to the heat block 10 like the collimating lens holder 44 of the first embodiment. The lens holder and optical axis are indicated by the reference letters H and O respectively in each of the drawings.

Figure 10:
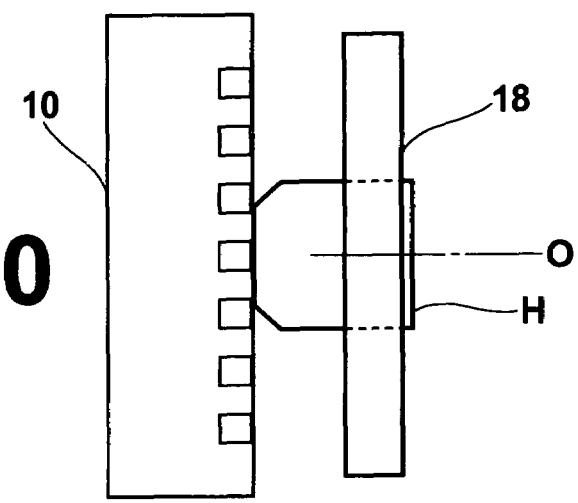
FIG. 10 is a plan view of a lens holder according to the present invention, illustrating an example shape thereof.
Figure 11:
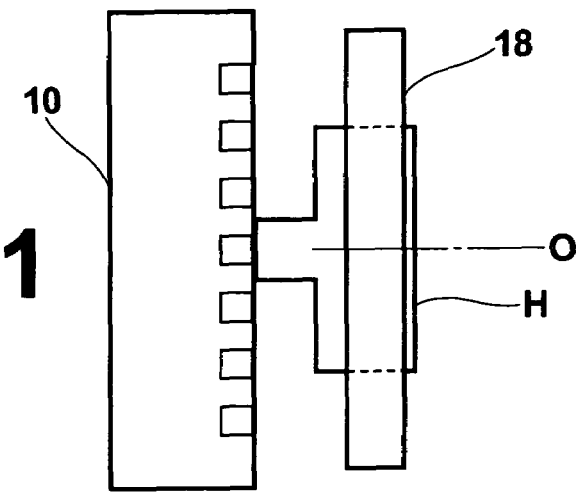
FIG. 11 is a plan view of a lens holder according to the present invention, illustrating an example shape thereof.
Figure 12:
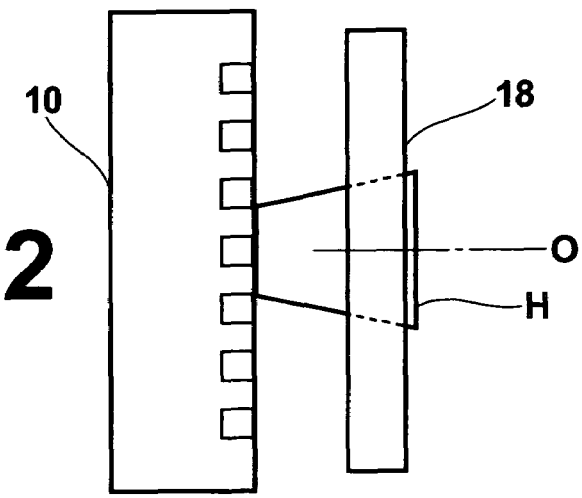
FIG. 12 is a plan view of a lens holder according to the present invention, illustrating an example shape thereof.
Figure 13:
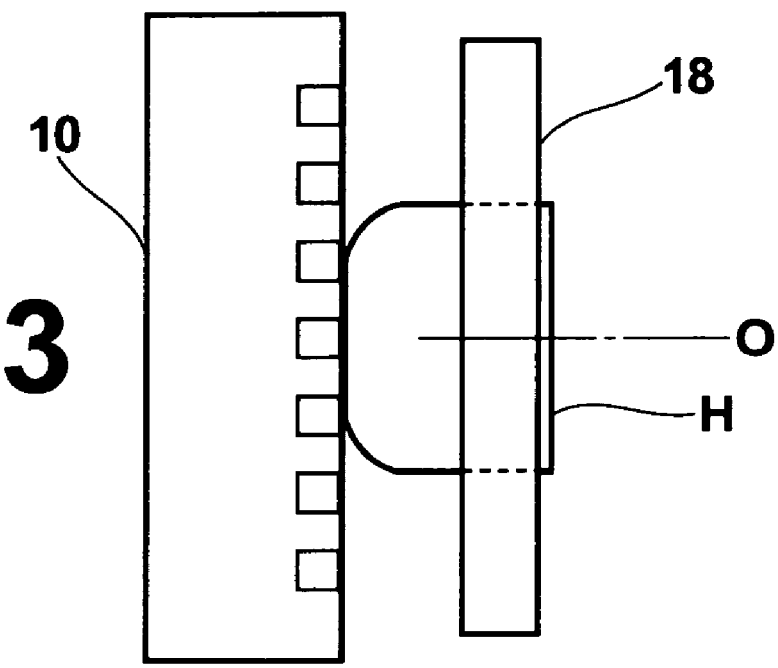
FIG. 13 is a plan view of a lens holder according to the present invention, illustrating an example shape thereof.
Figure 14:
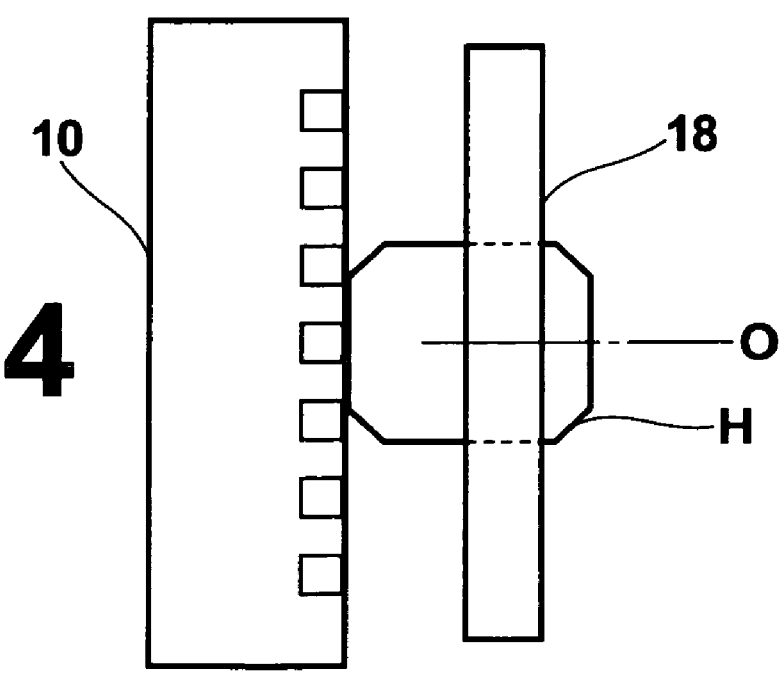
FIG. 14 is a plan view of a lens holder according to the present invention, illustrating an example shape thereof.

As for the planar shape of the lens holder H, those shown in FIGS. 10 to 14 may be employed as appropriate. The one shown in FIG. 10 is identical to the planar shape of the collimating lens holder 44 of the first embodiment.

Figure 15:
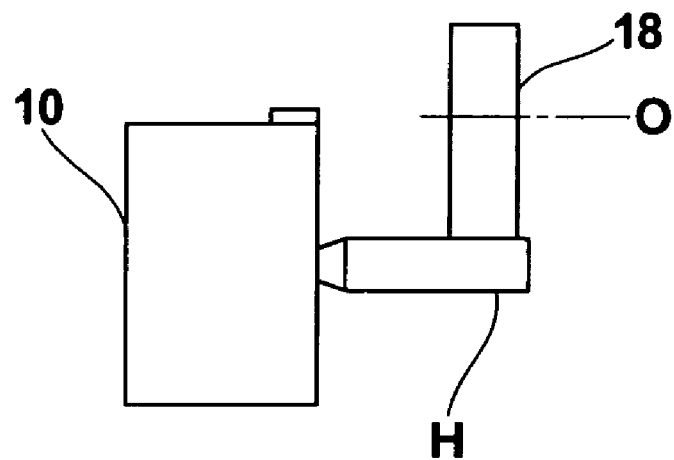
FIG. 15 is a side view of a lens holder according to the present invention, illustrating an example shape thereof.
Figure 16:
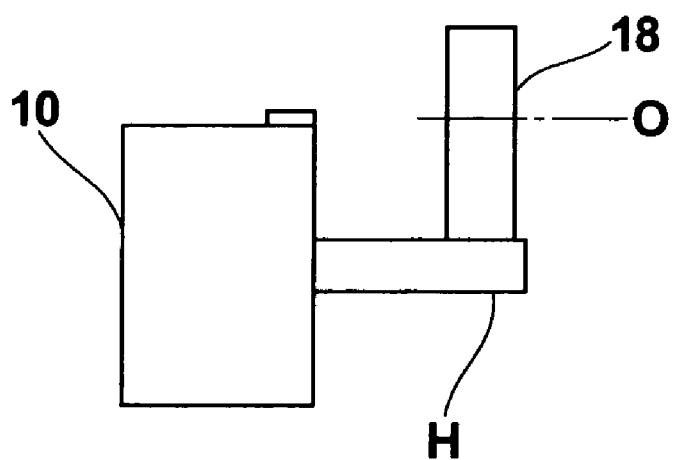
FIG. 16 is a side view of a lens holder according to the present invention, illustrating an example shape thereof.
Figure 17:
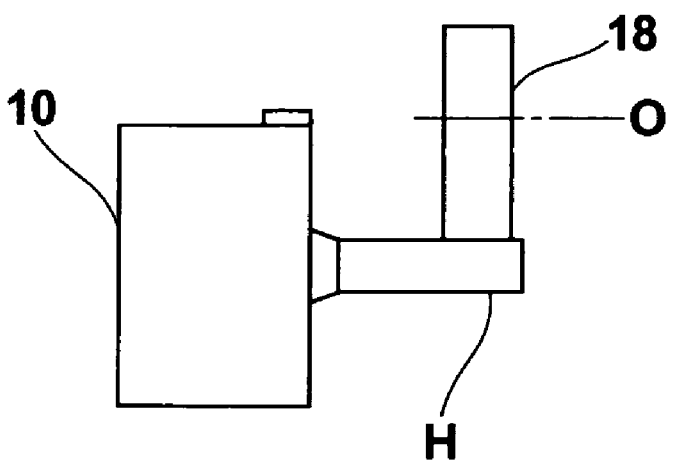
FIG. 17 is a side view of a lens holder according to the present invention, illustrating an example shape thereof.

As for the side shape of the lens holder H, those shown in FIGS. 15 to 17 may be employed as appropriate. The one shown in FIG. 15 is identical to the side shape of the collimating lens holder 44 of the first embodiment.

Figure 18A:
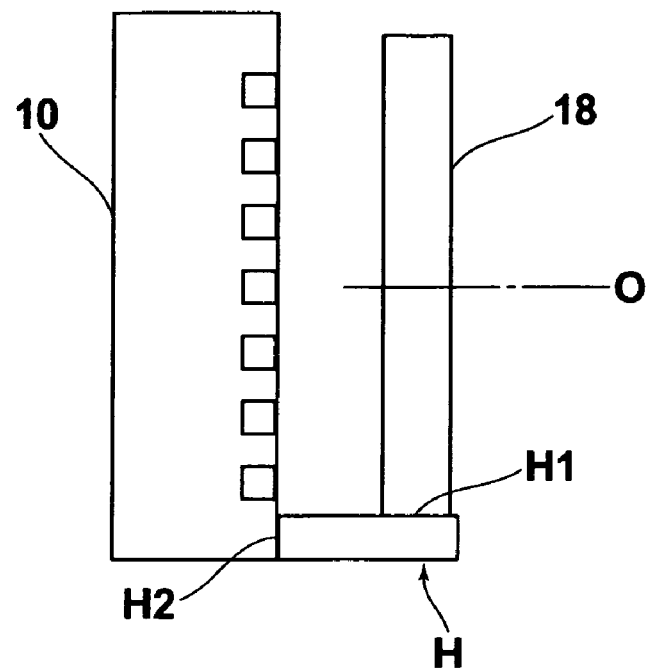
FIG. 18A is a plan view of a lens holder according to the present invention, illustrating an example shape thereof.
Figure 18B:
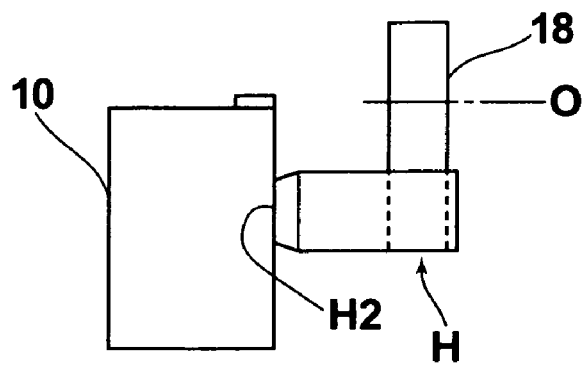
FIG. 18B is a side view of a lens holder according to the present invention, illustrating an example shape thereof.

Further, a lens holder H having planner and side shapes respectively shown in FIGS. 18A and 18B may also be formed. The lens holder H is fixedly bonded to the heating block 10 with one of the side end faces of the collimating lens array 18 fixedly bonded thereto. Here again, the lens holder H is formed such that the length of the side surface H1 for bonding the collimating lens array 18 in the direction orthogonal to the optical axis direction of the lens (length in the up-down direction in FIG. 18B) is longer than the length of the surface H2 to be bonded to the heat block 10 in the same direction. Thus, the former length may be set long enough to improve the face alignment accuracy with the collimating lens array 18. On the other hand, the latter length may be set appropriately short within a range which ensures the bonding strength to minimize the strain that may occur at the bonded section with the heat block 10 due to the temperature change, thereby unsticking or the like arising from the strain may be prevented.

In the embodiments described above, the collimating lens array 18 and condenser lens 20 are employed. A beam combining laser unit using a single condenser lens having both functions of the collimating lens array and condenser lens is also proposed as described, for example, in U.S. Pat. No. 6,995,912. The present invention may also be applied to a laser array unit that uses such condenser lens array or an elongated lens, such as a cylindrical lens or the like in a similar way.

Further, the embodiments of the present invention in the form of a beam combining laser unit have been described. But the present invention may also be applied to the lens holder used in a laser array unit without having such beam combining function or any other unit in a similar fashion.

What is claimed is:

1. A lens holder to be fixedly bonded to a certain other fixing member after a lens array or an elongated lens is fixedly bonded to the lens holder, wherein:
   the lens holder is formed such that a length of an area of the lens holder on which area the lens array or the elongated lens is to be bonded is longer than a length of a region of the lens holder which region is to be bonded to the certain other fixing member,
   the length of the area of the lens holder is along a first direction that is orthogonal to the optical axis direction of the lens array or the elongated lens,
   the length of the region of the lens holder is along a second direction that is orthogonal to the optical axis direction of the lens array or the elongated lens, and
   the first direction and the second direction are parallel to each other.

2. The lens holder according to claim 1, wherein the lens holder is formed of a material having a linear expansion coefficient different from that of the certain other fixing member.

3. The lens holder according to claim 1, wherein the region of the lens holder to be bonded to the certain other fixing member is shaped substantially in square.

4. The lens holder according to claim 2, wherein the region of the lens holder to be bonded to the certain other fixing member is shaped substantially in square.

5. The lens holder according to claim 1, wherein the region of the lens holder to be bonded to the certain other fixing member is shaped substantially in regular polygon or round.

6. The lens holder according to claim 2, wherein the region of the lens holder to be bonded to the certain other fixing member is shaped substantially in regular polygonal or round.

7. The lens holder according to claim 1, wherein the lens holder is formed of substantially transparent glass, synthetic resin (plastic), or ceramics.

8. The lens holder according to claim 2, wherein the lens holder is formed of substantially transparent glass, synthetic resin (plastic), or ceramics.

9. A laser array unit using the lens holder according to claim 1, the laser array unit comprising:
   a laser array having a plurality of luminous points;
   a laser supporting member with the laser array fixed thereto;
   a lens array or an elongated lens for receiving a plurality of laser beams emitted from the laser array; and
   the lens holder fixedly bonded to the laser supporting member after the lens array or elongated lens is fixedly bonded thereto.

10. A laser array unit using the lens holder according to claim 2, the laser array unit comprising:
    a laser array having a plurality of luminous points;
    a laser supporting member with the laser array fixed thereto;
    a lens array or an elongated lens for receiving a plurality of laser beams emitted from the laser array; and
    the lens holder fixedly bonded to the laser supporting member after the lens array or elongated lens is fixedly bonded thereto.

11. A laser array unit using the lens holder according to claim 1, the laser array unit comprising:
    a laser array having a plurality of luminous points;
    a laser supporting member with the laser array fixed thereto;
    a reference member with the laser supporting member fixed thereto;
    a lens array or an elongated lens for receiving a plurality of laser beams emitted from the laser array; and
    the lens holder fixedly bonded to the reference member after the lens array or elongated lens is fixedly bonded thereto.

12. A laser array unit using the lens holder according to claim 2, the laser array unit comprising:
    a laser array having a plurality of luminous points;
    a laser supporting member with the laser array fixed thereto;
    a reference member with the laser supporting member fixed thereto;
    a lens array or an elongated lens for receiving a plurality of laser beams emitted from the laser array; and
    the lens holder fixedly bonded to the reference member after the lens array or elongated lens is fixedly bonded thereto.

13. The laser array unit according to claim 9, wherein the lens array or elongated lens is a collimating lens array constituted by a plurality of collimating lenses arranged side by side, each for collimating each of the laser beams emitted from the plurality of luminous points.

14. The laser array unit according to claim 10, wherein the lens array or elongated lens is a collimating lens array constituted by a plurality of collimating lenses arranged side by side, each for collimating each of the laser beams emitted from the plurality of luminous points.

15. The laser array unit according to claim 11, wherein the lens array or elongated lens is a collimating lens array constituted by a plurality of collimating lenses arranged side by side, each for collimating each of the laser beams emitted from the plurality of luminous points.

16. The laser array unit according to claim 12, wherein the lens array or elongated lens is a collimating lens array constituted by a plurality of collimating lenses arranged side by side, each for collimating each of the laser beams emitted from the plurality of luminous points.

17. The laser array unit according to claim 9, further comprising:
    a single optical fiber; and
    a condensing optical system for condensing and inputting the laser beams emitted from the plurality of luminous points to the optical fiber, the condensing optical system being formed to include the lens array or elongated lens.

18. The laser array unit according to claim 11, further comprising:
a single optical fiber; and
a condensing optical system for condensing and inputting the laser beams emitted from the plurality of luminous points to the optical fiber, the condensing optical system being formed to include the lens array or elongated lens.

19. The laser array unit according to claim 9, wherein the laser array is constituted by GaN semiconductor lasers.

20. The laser array unit according to claim 11, wherein the laser array is constituted by GaN semiconductor lasers.

* * * * *